(12) United States Patent
Bian

(10) Patent No.: US 7,241,725 B2
(45) Date of Patent: Jul. 10, 2007

(54) BARRIER POLISHING FLUID

(75) Inventor: Jinru Bian, Newark, DE (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 202 days.

(21) Appl. No.: 10/670,587

(22) Filed: Sep. 25, 2003

(65) Prior Publication Data

US 2005/0070211 A1    Mar. 31, 2005

(51) Int. Cl.
    *C11D 7/50* (2006.01)
(52) U.S. Cl. .................. 510/175; 510/176; 438/692; 134/1.3
(58) Field of Classification Search ............... None
    See application file for complete search history.

(56) References Cited

U.S. PATENT DOCUMENTS

| | | | |
|---|---|---|---|
| 3,895,956 A | | 7/1975 | Yoshida et al. |
| 3,951,786 A | * | 4/1976 | Petrovich ............ 209/166 |
| 4,253,886 A | * | 3/1981 | Aonuma et al. ......... 148/105 |
| 4,479,917 A | * | 10/1984 | Rothgery et al. ........... 422/16 |
| 4,650,746 A | * | 3/1987 | Simson et al. ............ 430/438 |
| 4,777,118 A | * | 10/1988 | Kitchin et al. ............ 430/264 |
| 4,948,700 A | * | 8/1990 | Maeda et al. ............ 430/280.1 |
| 5,068,167 A | * | 11/1991 | Hall ..................... 430/264 |
| 5,420,188 A | * | 5/1995 | Dewhurst ................ 524/714 |
| 5,676,587 A | | 10/1997 | Landers et al. |
| 5,860,848 A | | 1/1999 | Loncki et al. |
| 5,885,362 A | * | 3/1999 | Morinaga et al. ............ 134/2 |
| 5,985,748 A | | 11/1999 | Watts et al. |
| 6,001,730 A | | 12/1999 | Farkas et al. |
| 6,153,359 A | * | 11/2000 | Shimizu et al. ........... 252/79.1 |
| 6,344,157 B1 | * | 2/2002 | Cheng et al. ............. 252/512 |
| 6,344,432 B1 | * | 2/2002 | Wojtczak et al. .......... 510/175 |
| 6,350,687 B1 | * | 2/2002 | Avanzino et al. .......... 438/687 |
| 6,436,834 B1 | * | 8/2002 | Lee et al. ................ 438/693 |
| 6,447,695 B1 | | 9/2002 | Motonari et al. |
| 6,465,403 B1 | * | 10/2002 | Skee ................... 510/175 |
| 6,638,143 B2 | * | 10/2003 | Wang et al. ............... 451/41 |
| 6,727,042 B2 | * | 4/2004 | Takagi et al. ............ 430/280.1 |
| 6,805,812 B2 | * | 10/2004 | Fang .................... 252/79.1 |
| 2001/0055880 A1 | | 12/2001 | Li et al. |
| 2002/0016073 A1 | | 2/2002 | Kondo et al. |
| 2002/0019202 A1 | | 2/2002 | Thomas et al. |
| 2002/0022370 A1 | | 2/2002 | Sun et al. |
| 2002/0025605 A1 | | 2/2002 | Homma et al. |
| 2002/0025762 A1 | | 2/2002 | Luo et al. |
| 2002/0065204 A1 | * | 5/2002 | Wojtczak et al. .......... 510/175 |
| 2002/0095874 A1 | | 7/2002 | Tsuchiya et al. |
| 2003/0131535 A1 | | 7/2003 | Small et al. |
| 2003/0181345 A1 | | 9/2003 | Bian |
| 2004/0104377 A1 | * | 6/2004 | Phelps et al. ............. 252/387 |
| 2006/0073667 A1 | * | 4/2006 | Li et al. ................. 438/311 |

FOREIGN PATENT DOCUMENTS

| | | |
|---|---|---|
| EP | 0 678 571 B1 | 10/1995 |
| EP | 1 072 662 A1 | 1/2001 |
| GB | 679561 | 9/1952 |
| WO | WO 96/38262 A1 | 12/1996 |
| WO | WO 01/12740 A1 | 2/2001 |

\* cited by examiner

*Primary Examiner*—Gregory Webb
(74) *Attorney, Agent, or Firm*—Blake T. Biederman

(57) ABSTRACT

The polishing fluid is useful for polishing tantalum-containing barrier materials of a semiconductor substrate. The polishing fluid includes a nitrogen-containing compound having at least two nitrogen atoms comprising imine compounds and hydrazine compounds. The nitrogen-containing compound is free of electron-withdrawing substituents; and the polishing fluid is capable of removing the tantalum-containing barrier materials from a surface of the semiconductor substrate without an abrasive.

6 Claims, No Drawings

BARRIER POLISHING FLUID

BACKGROUND

The invention relates to polishing semiconductor substrates and, more particularly, to an abrasive-free polishing fluids to remove barrier layers.

Circuit interconnects for semiconductor devices can be formed in a dielectric layer in which multiple trenches are arranged. The interconnects are formed by applying a barrier film over the underlying dielectric layer, followed by applying a metal layer over the barrier film. The metal layer is formed to a sufficient thickness to fill the trenches with metal. The interconnect fabrication process includes the use of a two-step chemical mechanical polishing (CMP) process.

CMP refers to a process of polishing a semiconductor wafer with a polishing pad and a polishing fluid. In a first polishing step, the metal layer is removed from the underlying barrier film and from the underlying dielectric layer. The metal layer is removed, both by abrasion applied by the polishing pad, and by chemical reaction with the polishing fluid accompanied by dissolution of the products of chemical reaction. The first polishing step removes the metal layer, leaving a smooth planar polished surface on the wafer, and further leaving metal in the trenches to provide circuit interconnects that are substantially planar with the polished surface. In addition to metal removal, some first-step polishing processes require removal of a dielectric layer. For example, Lee et al., in EP Pat. Pub. No. 1 072 662 A1, disclose the use of guanidine as an abrasion accelerator for accelerating an abrasive composition's dielectric removal rate.

A typical first-step polishing process includes an aqueous solution having an oxidizing reagent, such as $KNO_3$ or $H_2O_2$, in a polishing fluid to remove copper interconnects. The copper metal layer is removed by oxidation of the metal layer by the oxidizing reagent, and by abrasion of the polishing pad. Further, the polishing pad abrades the metal layer to minimize redeposition of the dissolved oxides from the solution onto the surface of the material being polished. The copper is removed from an underlying barrier film, for example, of tantalum (Ta) or tantalum nitride (TaN). The barrier film is more resistant to abrasion than is the copper, such that the barrier film acts as a polish stop for stopping the first-step polishing of copper. Further, oxidation of the surface of the barrier film by the polishing fluid will inhibit its removal during first-step polishing.

In a second polishing step, the barrier film is removed from the underlying dielectric layer. Second-step polishing can provide a smooth, planar polished surface on the dielectric layer. Ideally, the second polishing step does not remove excessive metal in the trenches. Excess metal removal in the second polishing step can contribute to dishing.

Dishing is a term of art that describes the formation of unwanted cavities in the circuit interconnects caused by removing excess metal in the trenches. Dishing can occur in both the first polishing step and in the second polishing step. The circuit interconnects are required to have precise dimensions that determine the electrical impedance of signal transmission lines, as provided by the circuit interconnects. Dishing in excess of acceptable levels causes dimensional defects in the circuit interconnects, which can contribute to attenuation of electrical signals transmitted by the circuit interconnects.

The second polishing step should cause minimal erosion. Erosion is a term of art that describes the unwanted lowering of the surface of the dielectric layer caused by removing some of the dielectric layer underlying the barrier film. Erosion that occurs adjacent to the metal in the trenches causes dimensional defects in the circuit interconnects, which can contribute to attenuation of electrical signals transmitted by the circuit interconnects. To minimize erosion, a polishing fluid for second-step polishing is desired to remove the barrier film with a higher removal rate than the removal rate for the dielectric layer.

The second polishing step should have high removal selectivity for the barrier layer relative to the underlying layers. Removal selectivity is defined as a ratio of the removal rate of the barrier film, relative to the removal rate of the comparison layer, for example a dielectric layer or a metal film. For purposes of this specification, selectivity refers to the ratio in removal rate in distance per unit time, such as angstroms per minute. Thus, removal selectivity is a measure of the removal of the barrier film relative to the dielectric layer or the metal film. In addition, increased removal selectivities can improve polishing performance. Polishing with a polishing fluid that exhibits a high removal selectivity relative to the dielectric layer increases removal of the barrier film and decreases removal of the dielectric layer.

State of the art slurries require-significant quantities of abrasive particles to remove barrier layers. Unfortunately, these slurries often result in unacceptable dishing of metal interconnects and dielectric erosion. In view of this, there is an ongoing desire for a barrier removal composition that removes barriers at a high rate with reduced dishing of metal interconnects and erosion of dielectrics.

STATEMENT OF INVENTION

The invention provides a polishing fluid useful for polishing tantalum-containing barrier materials of a semiconductor substrate comprising: a nitrogen-containing compound having at least two nitrogen atoms comprising at least one of a compound of a formula selected from the group comprising:

imine compounds

and hydrazine compounds $R^3R^4N—N R^5R^6$ (II), wherein $R^1$ comprises —H or —$NH_2$ and $R^2$, $R^3$, $R^4$, $R^5$ and $R^6$ independently comprise substituents selected from the group consisting of —H, a hydrocarbon group, an amino group, a carbonyl group, an imido group, an azo group, a cyano group, a thio group, a seleno group and —$OR^7$ where $R^7$ comprises a hydrocarbon group, and the nitrogen-containing compound being free of electron-withdrawing substituents; and the polishing fluid being capable of removing the tantalum-containing barrier materials from a surface of the semiconductor substrate without an abrasive.

An additional aspect of the invention provides a polishing fluid useful for polishing tantalum-containing barrier materials of a semiconductor substrate comprising: 0 to 6 inhibitor for reducing the removal of an interconnect metal; 0 to 1 weight percent abrasive particles; 0 to 25 oxidizing agent;

0 to 15 complexing agent and 0.05 to 25 nitrogen-containing compound having at least two nitrogen atoms comprising at least one of a compound of a formula selected from the group comprising:

imine compounds

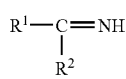

(I)

and hydrazine compounds $R^3R^4N$—$N$ $R^5R^6$ (II);

wherein $R^1$ comprises —H or —$NH_2$ and $R^2$, $R^3$, $R^4$, $R^5$ and $R^6$ independently comprise substituents selected from the group consisting of —H, a hydrocarbon group, an amino group, a carbonyl group, an imido group, an azo group, a cyano group, a thio group, a seleno group and —$OR^7$ where $R^7$ comprises a hydrocarbon group, and the nitrogen-containing compound having an electron-donating substituent; and the polishing fluid being capable of removing the tantalum-containing barrier materials from a surface of the semiconductor substrate without an abrasive.

In addition, the invention provides a method for polishing a semiconductor substrate, the semiconductor substrate having a metal interconnect layer and a tantalum-containing barrier layer adjacent the metal interconnect layer comprising: polishing a barrier layer a polishing fluid to remove at least a portion of the tantalum-containing barrier layer, the polishing fluid being abrasive-free and comprising a nitrogen-containing compound having at least two nitrogen atoms comprising at least one of a compound of a formula selected from the group comprising:

imine compounds

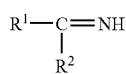

(I)

and hydrazine compounds $R^3R^4N$—$N$ $R^5R^6$ (II);

wherein $R^1$ comprises —H or —$NH_2$; and $R^2$, $R^3$, $R^4$, $R^5$ and $R^6$ independently comprise substituents selected from the group consisting of —H, a hydrocarbon group, an amino group, a carbonyl group, an imido group, an azo group, a cyano group, a thio group, a seleno group and —$OR^7$ where $R^7$ comprises a hydrocarbon group, and the nitrogen-containing compound being free of electron-withdrawing substituents.

DETAILED DESCRIPTION

In a preferred embodiment of the invention, an abrasive-free polishing fluid is formulated with a nitrogen-containing polishing agent such as an imine derivative compound or a hydrazine derivative compound.

Preferred imine derivatives include compounds of formula (I):

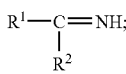

(I)

where $R^1$ is —H or —$NH_2$ and $R^2$ is —H, —$NH_2$, a hydrocarbon group, an amino group, a carbonyl group, an imido group, an azo group, a cyano group, a thio group, or a seleno group and —$OR^7$ where $R^7$ is a hydrocarbon group.

Preferred hydrazine derivatives include compounds of formula (II):

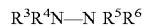

(II)

and where $R^3$, $R^4$, $R^5$, and $R^6$ are independently —H, —$OR^7$, —$NH_2$, a hydrocarbon group, a carbonyl group, an imido group, an azo group, a cyano group, a thio group, or a seleno group.

The term "nitrogen-containing" refers to a substance containing two or more nitrogen atoms. Two or more nitrogen atoms in a nitrogen-containing substance may be bonded to each other, or they may be separated by other atoms. If a nitrogen-containing substance contains three or more nitrogen atoms, some of the nitrogen atoms may be bonded to each other while others may be bonded to non-nitrogen atoms only. A nitrogen atom in a nitrogen-containing substance may be part of a chemical group within the substance, such as an amino, amido, azo, imino, imido, or hydrazino group. Preferably, the nitrogen atoms in a nitrogen-containing substance are in their reduced state and are bonded directly to an oxygen atom (i.e. —$NO_2$; —$NO_3$).

The term "hydrocarbon group" refers to a straight, branched or cyclic chain of carbon atoms substituted with hydrogen atoms, and includes unsubstituted and substituted alkyl groups, alkenyl groups, alkynyl groups, aryl groups, and heterocyclyl groups. Preferably, a hydrocarbon group contains from 1 to 20 carbon atoms. A hydrocarbon group may optionally be substituted with other groups. The bonds between the carbon atoms may be independently selected from single bonds, double bonds, and triple bonds.

The term "alkyl" (or alkyl- or alk-) refers to a substituted or unsubstituted, straight, branched or cyclic hydrocarbon chain that preferably contains from 1 to 20 carbon atoms. Alkyl groups include, for example, methyl, ethyl, propyl, isopropyl, cyclopropyl, butyl, iso-butyl, tert-butyl, sec-butyl, cyclobutyl, pentyl, cyclopentyl, hexyl and cyclohexyl.

The term "alkenyl" (or alkenyl- or alken-) refers to a substituted or unsubstituted, straight, branched or cyclic hydrocarbon chain that contains at least one carbon-carbon double bond, and that preferably contains from 2 to 20 carbon atoms. Alkenyl groups include, for example, ethenyl (or vinyl, —CH=$CH_2$); 1-propenyl; 2-propenyl (or allyl, —$CH_2$—CH=$CH_2$); 1,3-butadienyl (—CH=CHCH=$CH_2$); 1-butenyl (—CH=$CHCH_2CH_3$); hexenyl; pentenyl; 1,3,5-hexatrienyl; cyclohexadienyl; cyclohexenyl; cyclopentenyl; cyclooctenyl; cycloheptadienyl; and cyclooctatrienyl.

The term "alkynyl" (or alkynyl- or alkyn-) refers to a substituted or unsubstituted, straight, branched or cyclic hydrocarbon chain that contains at least one carbon-carbon triple bond, and that preferably contains from 2 to 20 carbon atoms. Alkynyl groups include, for example, ethynyl (or acetylenyl, —C≡$CH_2$); 2-methyl-3-butynyl; and hexynyl.

The term "aryl" refers to any substituted or unsubstituted aromatic carbocyclic group that preferably contains from 3 to 20 carbon atoms. An aryl group can be monocyclic or polycyclic. Aryl groups include, for example, phenyl, naphthyl, biphenyl, benzyl, tolyl, xylyl, phenylethyl, benzoate, alkylbenzoate, aniline, and N-alkylanilino.

The term "heterocyclyl group" refers to a saturated, unsaturated, or aromatic ring moiety that contains one or more heteroatoms, and that preferably contains from 5 to 10, more preferably from 5 to 6, ring atoms. The term "ring atoms" refers to atoms that are incorporated into the ring structure and excludes other atoms that are pendant to the ring. The ring can be mono-, bi- or polycyclic. A heterocyclic group contains carbon atoms and from 1 to 3 heteroatoms independently selected from the group consisting of nitrogen, oxygen, and sulfur. Heterocyclic groups, which may also be substituted or unsubstituted, include, for example, benzimidazole, benzotriazole, furan, imidazole, indole, isoquinoline, isothiazole, morpholine, piperazine, pyrazine, pyrazole, pyridine, pyrimidine, pyrrole, quinoline, thiazole, thiophene, triazines and triazole.

The term "substituted," when used to describe a chemical group, refers to a chemical moiety that contains at least one, preferably from 1 to 5 substituents. Suitable substituents include, for example, hydroxyl (—OH), amino (—$NH_2$), oxy (—O—), carbonyl (>C═O), thiol, alkyl, halo, nitro, aryl and heterocyclic groups. These substituents can optionally be further substituted with from 1 to 5 substituents.

The term "amino group" refers to a group bonded to a substance through a nitrogen atom. For example, an amino group may be selected from the group comprising —$NH_2$; alkylamino (—NH-alkyl); dialkylamino (—N-(alkyl)$_2$); arylamino (—NH-aryl); and substituted derivatives thereof. Preferably, the alkyl groups bonded to the nitrogen contain from 1 to 20 carbon atoms, and the aryl groups bonded to the nitrogen contain from 3 to 20 carbon atoms. The alkyl groups in a dialkylamino group may be the same or may be different.

The term "carbonyl group" refers to a group containing a carbon atom doubly bonded to an oxygen atom, and includes carboxylic acids, anhydrides, carbonates, aldehydes, ketones, esters, carboxylic acid halides, and amides. For example, a carbonyl group may have the general formula (III):

where $R^8$ is —H, —OH, —$OR^9$, —$R^{10}$, —$NH_2$, and —NH—C(═O)—$R^{11}$; and $R^9$, $R^{10}$, and $R^{11}$ are independently alkyl groups containing from 1 to 10 carbon atoms.

The term "imido group" refers to a group containing a carbon atom doubly bonded to an —NH group. For example, an imido group may have the general formula (IV):

where $R^{12}$ is —H, —$NH_2$, or an alkyl group containing from 1 to 10 carbon atoms. The term "azo group" refers to a group containing a nitrogen-nitrogen double bond, or an —NH group singly bonded to another —NH group. For example, an azo group may be selected from the group consisting of —$N_3$; —NH—NH—$NH_3$; —N═N—$NH_3$; —N═N—$R^{13}$; —$R^{14}$═N—N═$R^{15}$; and —NH—NH—$R^{16}$; where $R^{13}$, $R^{14}$, $R^{15}$, and $R^{16}$ are independently alkyl groups containing from 1 to 10 carbon atoms.

The term "cyano group" refers to a group containing a triple bond between a carbon atom and a nitrogen atom, or a carbon atom doubly bonded to a nitrogen atom and also doubly bonded to another heteroatom such as oxygen, sulfur, or selenium. For example, a cyano group may be selected from the group consisting of —C≡N; —N≡C; —N═C═O; —N═C═S; and —N═C═Se.

The term "thio group" refers to a group containing a sulfur atom singly bonded to another atom. For example, a thio group may be selected from the group consisting of —S—$R^{17}$; —S—S—$R^{18}$; —S—C≡N; —$SO_2$H; and —SOH; where $R^{17}$ and $R^{18}$ are independently alkyl groups containing from 1 to 10 carbon atoms.

The term "seleno group" refers to a group containing a selenium atom singly bonded to another atom. For example, a seleno group may be selected from the group consisting of —Se—$R^{19}$; —Se—Se—$R^{20}$; and —Se—C≡N; where $R^{19}$ and $R^{20}$ are independently alkyl groups containing from 1 to 10 carbon atoms.

Preferred imine derivatives of formula (I) include, for example, 1,3-diphenyl guanidine, guanidine hydrochloride, tetramethylguanidine, formamidine acetate, and acetamidine hydrochloride.

Preferred hydrazine derivatives of formula (II) include, for example, carbohydrazide, imidazole, acetic hydrazide, semicarbazide hydrochloride, and formic hydrazide.

Imine derivative compounds of formula (I) preferably contain an electron-donating substituent as $R^1$ or $R^2$, and are free of electron-withdrawing substituents. More preferably, one of $R^1$ and $R^2$ is an electron-donating substituent, and the other substituent is either hydrogen or an electron-donating substituent. If two electron-donating substituents are present in an imine derivative compound, the substituents may be the same, or they may be different.

Imine derivative compounds of formula (II) preferably contain a hydrazine functionality (>N—$NH_2$) and contain no more than one electron-withdrawing substituent. A hydrazine functionality is provided when $R^3$ and $R^4$ are both hydrogen, or when $R^5$ and $R^6$ are both hydrogen.

For purposes of the specification, the term "electron-donating" refers to a chemical group bonded to a substance that transfers electron density to that substance. F. A. Carey and R. J. Sundberg, in *Advanced Organic Chemistry, Part A: Structure and Mechanisms*, 3$^{rd}$ Edition New York: Plenum Press (1990), p. 208 and 546–561 provide a more detailed description of electron-donating substituents. The imine derivative compounds have an electron-donating substituent that transfers sufficient electron density to the substance to establish a measurable partial positive charge on the substituent. Electron-donating substituents include, for example, amino, hydroxyl (—OH), alkyl, substituted alkyl, hydrocarbon radical, substituted hydrocarbon radical, amido, and aryl. These electron-donating substituents accelerate removal of tantalum-containing barrier materials.

In addition, abrasive additions render imine and hydrazine derivative compounds effective with electron-withdrawing substituents. The term "electron-withdrawing" refers to a chemical group bonded to a substance that transfers electron density away from that substance. Electron-withdrawing substituents transfer sufficient electron density away from the substance to establish a measurable partial negative charge on the substituent and do not accelerate barrier removal. Electron-withdrawing substituents include, for example, —O-alkyl; -halogen; —C(═O)H; —C(═)O-alkyl; —C(═O)OH; —C(═O)-alkyl; —$SO_2$H; —$SO_3$H; and —$NO_2$. The carbonyl groups that are electron-withdrawing are amide groups.

The nitrogen-containing polishing agent may be present in the fluid in a range of concentrations, for example from 0.05 to 25 weight percent. This specification refers to compositions by weight percent, unless specifically expressed otherwise. A single type of nitrogen-containing polishing agent may be present, or mixtures of nitrogen-containing polishing agents may be used. Preferably, the concentration of nitrogen-containing polishing agent is from 0.1 to 10 weight percent. More preferably, the concentration of nitrogen-containing polishing agent is from 1 to 5 weight percent. Even more preferably, the concentration of nitrogen-containing polishing agent is from 1.5 to 3 weight percent. In a most preferred embodiment, the concentration of nitrogen-containing polishing agent is at least 2 weight percent.

Optionally, the composition contains 0 to 25 weight percent oxidizer. Preferably, the composition contains 0 to 15 weight percent oxidizer. The oxidizer is particularly effective in accelerating the removal rate of interconnect metals, such as copper. The oxidizing agent can be at least one of a number of oxidizing compounds, such as hydrogen peroxide ($H_2O_2$), monopersulfates, iodates, magnesium perphthalate, peracetic acid, periodates, perbromates, perchlorates, persulfates, bromates, nitrates, iron salts, cerium salts, Mn (III), Mn (IV) and Mn (VI) salts, silver salts, Cu salts, chromium salts, cobalt salts, halogens hypochlorites and mixtures thereof. Furthermore, it is often advantageous to use a mixture of oxidizer compounds. The most advantageous oxidizers are hydrogen peroxide and iodate. When the polishing fluid contains an unstable oxidizing agent, such as hydrogen peroxide, it is often most advantageous to mix the oxidizer into the slurry at the point of use. Since this composition operates without an oxidizer at pH level above 7, most advantageously, the composition contains no oxidizer to limit undesirable static etch of metal interconnects, such as, copper. At pH levels below 7, the fluid requires an oxidizer to facilitate barrier removal.

The barrier removal agent provides efficacy over a broad pH range in solutions containing a balance of water. This solution's useful pH range extends at least from 2 to 12. Preferably, the solution has a pH between 7 and 12. Most preferably, the solution's pH is between 8 and 11. Typical agents for adjusting pH downward include nitric acid, sulfuric acid, hydrochloric acid, phosphoric acid and organic acids. Most preferably, potassium hydroxide and nitric acid provide final pH adjustments. In addition, the solution most advantageously relies upon a balance of deionized water to limit incidental impurities.

The polishing fluid for selective removal of a barrier layer contains a nitrogen-containing polishing agent in an aqueous mixture. The polishing fluid may also optionally contain a metal corrosion a complexing agent, a biocide, and a salt (for example a chloride salt such as ammonium chloride), as well as other additives that do not interfere with the CMP process.

Suitable metals used for the interconnect include, for example, copper, copper alloys, gold, gold alloys, nickel, nickel alloys, platinum group metals, platinum group metal alloys, silver, silver alloys, tungsten, tungsten alloys and mixtures comprising at least one of the foregoing metals. The preferred interconnect metal is copper. In acidic polishing compositions and fluids that utilize oxidizers such as hydrogen peroxide, both the copper removal rate and the static etch rate are high primarily because of oxidation of the copper. In order to reduce the removal rate of the interconnect metal the polishing composition employs a corrosion inhibitor. The corrosion inhibitor's function is to reduce removal of the interconnect metal. This facilitates improved polishing performance by reducing the dishing of the interconnect metal.

The inhibitor is typically present in an amount 0 to 6 weight percent—the inhibitor may represent a single or a mixture of inhibitors to the interconnect metal. Within this range, it is desirable to have an amount of inhibitor greater than or equal to 0.0025 weight percent, preferably greater than or equal to 0.10 weight percent. Also desirable within this range is an amount of less than or equal to 4 weight percent, preferably less than or equal to 1 weight percent. The preferred corrosion inhibitor is benzotriazole (BTA). In one embodiment, the polishing composition may contain a relatively large quantity of BTA inhibitor for reducing the interconnect removal rate. At BTA concentrations above 0.25 weight percent, an addition of supplemental corrosion inhibitors may be unnecessary. The preferred concentration of BTA is an amount of 0.0025 to 2 weight percent.

Exemplary complexing agents for optional use in the polishing fluid include acetic acid, citric acid, ethyl acetoacetate, glycolic acid, lactic acid, malic acid, oxalic acid, salicylic acid, sodium diethyl dithiocarbamate, succinic acid, tartaric acid, thioglycolic acid, glycine, alanine, aspartic acid, ethylene diamine, trimethylene diamine, malonic acid, gluteric acid, 3-hydroxybutyric acid, propionic acid, phthalic acid, isophthalic acid, 3-hydroxy salicylic acid, 3,5-dihydroxy salicylic acid, gallic acid, gluconic acid, pyrocatechol, pyrogallol, gallic acid, tannic acid and salts thereof. Preferably, the complexing agent used in the polishing fluid is citric acid. Most advantageously, the polishing fluid contains 0 to 15 weight percent complexing agent.

Although the nitrogen-containing polishing agents provide efficacious abrasive-free polishing fluids, it may be desirable to add an abrasive to the polishing fluid in some applications. The polishing composition may optionally contain up to 25 wt % abrasive to facilitate silica removal or combined barrier and silica removal depending upon the integration scheme, the polishing composition may serve to remove the mask layer or to first remove a barrier layer and then remove a silicon oxide-containing layer. The polishing composition optionally includes an abrasive for "mechanical" removal of barrier layers. The abrasive is preferably a colloidal or fumed abrasive. Example abrasives include inorganic oxides, metal borides, metal carbides, metal nitrides, polymer particles and mixtures comprising at least one of the foregoing. Suitable inorganic oxides include, for example, silica ($SiO_2$), alumina ($Al_2O_3$), zirconia ($ZrO_2$), ceria ($CeO_2$), manganese oxide ($MnO_2$), or combinations comprising at least one of the foregoing oxides. Modified forms of these inorganic oxides such as polymer-coated inorganic oxide particles and inorganic coated particles may also be utilized if desired. Suitable metal carbides, boride and nitrides include, for example, silicon carbide, silicon nitride, silicon carbonitride (SiCN), boron carbide, tungsten carbide, zirconium carbide, aluminum boride, tantalum carbide, titanium carbide, or combinations comprising at least one of the foregoing metal carbides, boride and nitrides. Diamond may also be utilized as an abrasive if desired. Alternative abrasives also include polymeric particles and coated polymeric particles. The preferred abrasive is silica.

To limit erosion and dishing, it is advantageous to use the abrasive in an amount of less than 5 weight percent. Using 0 to 1 or less than 1 weight percent abrasive further facilitates limiting dishing and erosion. Most advantageously, the polishing fluid contains no abrasive to further reduce dishing and erosion.

The abrasive has an average particle size of less than or equal to 150 nanometers (nm) for preventing excessive metal dishing and dielectric erosion. For purposes of this specification, particle size refers to the average particle size of the abrasive. It is desirable to use a colloidal abrasive having an average particle size of less than or equal to 100 nm, preferably less than or equal to 50 nm, and more preferably less than or equal to 40 nm. The least dielectric erosion and metal dishing advantageously occurs with colloidal silica having an average particle size of less than or equal to 40 nm. Decreasing the size of the colloidal abrasive to less than or equal to 40 nm, tends to improve the selectivity of the polishing composition; but it also tends to decrease the barrier removal rate. In addition, the preferred colloidal abrasive may include additives, such as dispersants, surfactants and buffers to improve the stability of the colloidal abrasive at acidic pH ranges. One such colloidal abrasive is colloidal silica from Clariant S.A., of Puteaux, France. The chemical mechanical planarizing composition can also optionally include brighteners, such as, ammonium chloride, complexing agents, chelating agents, pH buffers, biocides and defoaming agents.

If the polishing composition does not contain abrasives, then pad selection and conditioning become more important to the chemical mechanical planarizing (CMP) process. For example, for some abrasive-free compositions, a fixed abrasive pad improves polishing performance.

The solution relies upon a barrier removal agent to remove tantalum-containing barrier materials. For purposes of this specification, tantalum-containing barrier materials refer to tantalum, tantalum-containing alloys, tantalum-base alloys and tantalum intermetallics. The solution has particular effectiveness for tantalum, tantalum-base alloys and tantalum intermetallics, such as tantalum carbides, nitrides and oxides. The slurry is most effective for removing tantalum and tantalum nitride barriers from patterned semiconductor wafers.

Typical dielectric materials used in composite semiconductor substrates include $SiO_2$, tetraethylorthosilicate (TEOS), phosphosilicate glass (PSG), boron phosphosilicate glass (BPSG), or a low-k dielectric. Low-k dielectrics include porous silica and organic low-k dielectrics, such as fluoropolymers and copolymers.

It is desirable to remove the metal at a high rate to avoid dishing. It is also desirable to remove the dielectric at a high rate to avoid erosion. Preferably, the removal selectivity of the polishing fluid for the barrier relative to the dielectric is at least 10, and more preferably at least 20, and even more preferably at least 50, and still more preferably at least 100. Preferably, the removal selectivity of the polishing fluid for the barrier relative to the metal is at least 5, and more preferably at least 10, and most preferably at least 15.

EXAMPLES

Experiments were conducted to test variations in the composition of a polishing fluid for second-step polishing by CMP to remove, at reasonable rates, a barrier film of TaN from an underlying dielectric layer of silica on a semiconductor wafer, while minimizing erosion of the dielectric layer and minimizing dishing of metal in the trenches on a semiconductor wafer. Removal rates were determined on (200 mm) semiconductor wafers polished with the recited polishing fluids on a Strausbaugh polishing machine using a Politex polishing pad (available from Rodel, Inc., Newark, Del.) under downforce conditions of about 3 pounds per square inch (psi) or 20.7 kPa and a polishing fluid flow rate of about 200 cubic centimeters per minute (cc/min). Experiments were performed by separately polishing a barrier film of tantalum nitride (TaN), a dielectric layer of tetraethylorthosilicate (TEOS) and a metal film of copper (Cu), using a polishing pad and a polishing fluid.

The polishing fluids tested were at pH 9 (pH adjusted with potassium hydroxide, nitric acid and balance deionized water) and contained 0.1 wt. % benzotriazole (BTA) and 0.01 wt. % Neolone™ M-50 biocide (Rohm and Haas Company, Philadelphia, Pa., USA). The presence of corrosion inhibitor BTA inhibits the oxidation of metals on the wafer. The biocide is typically used in the concentrations prescribed by the supplier. The polishing fluids may also comprise small amounts of ammonium chloride for polishing semiconductor substrates that contain copper interconnects. The enumerated tests represent examples of the invention and the alphabetically listed tests represent comparative examples.

Example 1

Imine Derivatives as Polishing Agents for CMP

The imine derivative compounds listed in Table 1 were used as nitrogen-containing polishing agents for CMP. The structures listed under the headings "$R^1$" and "$R^2$" correspond to the substituents in structure (I):

TABLE 1

| | Imine Derivative Compounds in Abrasive-Free Polishing Fluids | | | | | | |
|---|---|---|---|---|---|---|---|
| Test | Additive | $R^1$ | $R^2$ | Wt. % | TaN Å/min | TEOS Å/min | Cu Å/min |
| 1 | 1,3-Diphenyl guanidine | —NH—$C_6H_5$ | —NH—$C_6H_5$ | 2 | 2385 | −3 | 110 |
| 2 | Guanidine hydrochloride | —$NH_2$ | —$NH_2$ {•HCl} | 2 | 1392 | −1 | 97 |
| 3 | Tetramethyl-guanidine | —$N(CH_3)_2$ | —$N(CH_3)_2$ | 2 | 1199 | 1 | 27 |
| 4 | Formamidine acetate | —H | —$NH_2$ {•$CH_3COOH$} | 2 | 2197 | −5 | 99 |
| 5 | Acetamidine hydrochloride | —$CH_3$ | —$NH_2$ {•HCl} | 1 | 477 | 1 | 80 |
| 6 | Acetamidine hydrochloride | —$CH_3$ | —$NH_2$ {•HCl} | 2 | 450 | 3 | 81 |

TABLE 1-continued

Imine Derivative Compounds in Abrasive-Free Polishing Fluids

| Test | Additive | $R^1$ | $R^2$ | Wt. % | TaN Å/min | TEOS Å/min | Cu Å/min |
|---|---|---|---|---|---|---|---|
| A | o-Methylisourea sulfate | —$OCH_3$ | —$NH_2$ {•0.5 $H_2SO_4$} | 2 | −8 | −2 | 26 |
| B | 1-Methyl-3-nitroguanidine | —NH—$CH_3$ | —NH—$NO_2$ | 2 | −18 | 0 | 51 |
| C | Arginine | —$NH_2$ | —NH—$(CH_2)_3$—CH($NH_2$)—C(=O)OH | 2 | −18 | −5 | 19 |
| D | Formamidine-sulfinic acid | —$NH_2$ | —S(=O)OH | 2 | 139 | −1 | 75 |
| E | Formamidine-sulfinic acid | —$NH_2$ | —S(=O)OH | 1 | −6 | 2 | 85 |
| F* | 2,2-Azobis(dimethyl-propionamidine)di-HCl | —$NH_2$ {•HCl} | —$R^{21}$—N=N—$R^{22}$—C($NH_2$)=NH {•HCl} | 2 | −1 | −1 | 75 |
| G | (control) | — | — | — | −15 | 0 | 30 |

*$R^{21}$ = —C($CH_3$)$_2$—$CH_2$—
$R^{22}$ = —$CH_2$—C($CH_3$)$_2$—

Imine derivative compounds, as described in Example 1 and Table 1, provided good TaN removal rates and good removal selectivities when the compounds were free of electron-withdrawing substituents and contained at least one electron-donating substituent. Thus, the compounds of Tests 1–6 contained an electron-donating substituent such as —$NH_2$; —NH—$C_6H_5$; or —N($CH_3$)$_2$. These polishing agents provided abrasive-free TaN removal of at least 400 Å/min, with removal selectivities of at least 150 relative to the dielectric (removal rate of TaN/removal rate of TEOS), and at least 5 relative to the metal (removal rate of TaN/removal rate of Cu). The preferred imine derivative compounds of Tests 1–4 contained only substituents that were electron-donating or were hydrogen. These polishing agents provided abrasive-free TaN removal of at least 1000 Å/min, with removal selectivities of at least 1000 relative to the dielectric (Test 3), and at least 10 relative to the metal (Test 2). In contrast, the compounds of Tests A–G contained at least an electron-withdrawing substituent such as —$OCH_3$; —NH—$NO_2$; —$SO_2H$; —NH—$(CH_2)_3$—CH($NH_2$)—C(=O)OH; or —C($CH_3$)$_2$—$CH_2$—N=N—$CH_2$—C($CH_3$)$_2$—C($NH_2$)=NH. These polishing agents showed lower rates of TaN removal and poor removal selectivities relative to the dielectric and the metal.

Example 2

Hydrazine Derivatives as Polishing Agents for CMP

The hydrazine derivative compounds listed in Table 2 were used as nitrogen-containing polishing agents for CMP. The results of the polishing are given in Table 3. The structures listed under the headings "$R^3$" through "$R^6$" correspond to the substituents in structure (II):

(II).  $R^3R^4N—N R^5R^6$

TABLE 2

Hydrazine Derivative Compounds in Abrasive-Free Polishing Fluids

| Additive | $R^3$ | $R^4$ | $R^5$ | $R^6$ |
|---|---|---|---|---|
| Carbohydrazide | —H | —H | —H | —C(=O)—NH—$NH_2$ |
| Acetic hydrazide | —H | —H | —H | —C(=O)—$CH_3$ |
| Semicarbazide hydrochloride | —H | —H | —H | —C(=O)—$NH_2$ {•HCl} |
| Formic hydrazide | —H | —H | —H | —C(=O)H |
| 1,2-Diformylhydrazine | —H | —C(=O)H | —H | —C(=O)H |
| Methylhydrazino-carboxylate | —H | —$CH_3$ | —H | —C(=O)OH |
| Oxalic dihydrazide | —H | —H | —H | —(C(=O))$_2$—NH—$NH_2$ |
| Acetone azine | — | =C($CH_3$)$_2$ | — | =C($CH_3$)$_2$ |

TABLE 3

Hydrazine Derivative Compounds in Abrasive-Free Polishing Fluids

| Test | Additive | Wt. % | TaN Å/min | TEOS Å/min | Cu Å/min |
|---|---|---|---|---|---|
| 8 | Carbohydrazide | 2 | 1435 | −2 | 74 |
| 9 | Carbohydrazide | 2 | 1059 | −3 | 75 |
| 10 | Carbohydrazide | 2 | 1127 | −4 | 101 |
| 11 | Carbohydrazide | 2 | 1084 | 1 | −35 |
| 12 | Acetic hydrazide | 2 | 1603 | 1.4 | 139 |
| 13 | Semicarbazide hydrochloride | 2 | 1972 | 3.6 | 85 |
| 14 | Formic hydrazide | 2 | 1484 | 2.1 | 110 |
| H | 1,2-Diformylhydrazine | 2 | −2 | −4 | 4 |
| I | Methylhydrazino-carboxylate | 2 | −3 | 0 | 62 |
| J | Oxalic dihydrazide | 2 | −45 | 134 | 59 |
| K | Oxalic dihydrazide | 0.94 | −14 | 0 | 107 |
| L | Oxalic dihydrazide | 2 | −15 | −2 | −9 |
| M | Acetone azine | 2 | 10 | −1 | 39 |

Hydrazine derivative compounds, as described in Example 2 and Tables 2–3, provided good TaN removal rates and good removal selectivities when the compounds contained a hydrazine functionality (>N—$NH_2$) and no more than one electron-withdrawing substituent. The hydrazine functionality was provided in these examples when $R^3$ and $R^4$ were both hydrogen. Thus, the compounds of Tests 8–14 contained a hydrazine functionality and no more than one electron-withdrawing substituent. These polishing agents provided good TaN removal rates even though an electron-withdrawing group, such as a non-amide carbonyl group, was present. These polishing agents provided abrasive-free TaN removal of at least 1000 Å/min, with removal selectivities of at least 500 relative to the dielectric (Test 13), and at least 10 relative to the metal (Test 12). In contrast, the compounds of Tests H–M either did contain a hydrazine functionality (Tests H–I and M) or contained more than one electron-withdrawing substituent (i.e. two non-amide carbonyl groups; Tests J–L). These polishing agents showed lower rates of TaN removal and poor removal selectivities relative to the dielectric and the metal.

According to the results of these Examples, as recited in Tables 1–3, high removal rates of the TaN barrier film are obtained with an abrasive-free polishing fluid that includes a nitrogen-containing polishing agent. In particular, certain types of imine derivative compounds and hydrazine derivative compounds provided good removal rates for TaN. The good removal rates for TaN, at least 400 angstroms per minute (Å/min), were observed for Tests 1–6 (Table 1),and Tests 7–14 (Table 3). Preferred nitrogen-containing polishing agents provided TaN removal rates of at least 1000 Å/min (Tests 1–4 and 7–14).

The results shown in Tables 1–3 provide data showing that adequate removal of the barrier film (TaN) along with good removal selectivity versus the metal film (Cu) and the dielectric layer (TEOS) can occur when using abrasive-free polishing fluids containing nitrogen-containing polishing agents. The CMP polishing fluid containing a nitrogen-containing polishing agent that provides the advantages of high removal rate, low erosion rates and low dishing rates as set forth above. In particular, imine derivatives and hydrazine derivative compounds accelerate the removal of tantalum-containing barriers. In addition, the fluid's reduced or abrasive-free particle content decreases dielectric erosion and dishing of interconnect metals.

What is claimed is:

1. A polishing fluid useful for polishing tantalum-containing barrier materials of a semiconductor substrate, the semiconductor having a copper or copper alloy interconnect, comprising, by weight percent:

0.1 to 10 nitrogen-containing compound having at least two nitrogen atoms comprising at least one of a compound of a formula selected from the group comprising:

imine compounds

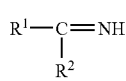

(I)

and hydrazine compounds $R^3R^4N-N\ R^5R^6$ (II),
wherein $R^3$, $R^4$, $R^5$ and $R^6$ independently comprise substituents selected from the group consisting of —H, a hydrocarbon group, an amino group, a carbonyl group, an imido group, an azo group, a cyano group, a thio group, a seleno group and —$OR^7$ where $R^7$ comprises a hydrocarbon group, and the nitrogen-containing compound being free of electron-withdrawing substituents and the imine compound includes either guanidine or formamidine; and 0.0025 to 2 benzotriazole; and the polishing fluid having a pH of 8 to 11, containing no abrasive particles and being capable of removing the tantalum-containing barrier materials from a surface of the semiconductor substrate.

2. The polishing fluid of claim 1, wherein the nitrogen-containing compound contains the imine compound.

3. The polishing fluid of claim 1, wherein the nitrogen-containing compound contains the hydrazine compound.

4. A polishing fluid useful for polishing tantalum-containing barrier materials of a semiconductor substrate, the semiconductor having a copper or copper alloy interconnect, comprising, by weight percent:

0.0025 to 2 benzotriazole for reducing the removal of the copper or copper alloy interconnect;

0 to 25 oxidizing agent;

0 to 15 complexing agent and 0.1 to 10 nitrogen-containing compound having at least two nitrogen atoms comprising at least one of a compound of a formula selected from the group comprising:

imine compounds

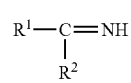

(I)

and hydrazine compounds $R^3R^4N-N\ R^5R^6$ (II);
wherein $R^3$, $R^4$, $R^5$ and $R^6$ independently comprise substituents selected from the group consisting of —H, a hydrocarbon group, an amino group, a carbonyl group, an imido group, an azo group, a cyano group, a thio group, a seleno group and —$OR^7$ where $R^7$ comprises a hydrocarbon group, and the nitrogen-containing compound having an electron-donating substituent, and the imine compound includes either guanidine or formamidine; and the polishing fluid having a pH of 8 to 11, containing no abrasive particles and being capable of removing the tantalum-containing barrier materials from a surface of the semiconductor substrate.

5. The polishing fluid of claim 4, wherein the nitrogen-containing compound contains the imine compound and the imine compound contains at least one selected from at least one of the group comprising 1,3-diphenyl guanidine, guanidine hydrochloride, tetramethylguanidine, formamidine acetate and acetamidine hydrochloride.

6. The polishing fluid of claim 4, wherein the nitrogen-containing compound contains the hydrazine compound and the hydrazine compound contains at least one selected from at least one of the group comprising carbohydrazide, acetic hydrazide, semicarbazide hydrochloride, and formic hydrazide.

* * * * *